(12) United States Patent
Denis et al.

(10) Patent No.: US 8,987,887 B2
(45) Date of Patent: Mar. 24, 2015

(54) INTERCONNECTION DEVICE FOR ELECTRONIC CIRCUITS, NOTABLY MICROWAVE ELECTRONIC CIRCUITS

(71) Applicant: Thales, Neuilly-sur-Seine (FR)

(72) Inventors: Stéphane Denis, La Bouexiere (FR); Dominique Leduc, Rennes (FR); Julien Fortel, Rennes (FR); Patrick Fouin, Vern sur Seiche (FR); Didier Briantais, Etrelles (FR)

(73) Assignee: Thales, Courbevoie (FR)

( * ) Notice: Subject to any disclaimer, the term of this patent is extended or adjusted under 35 U.S.C. 154(b) by 0 days.

(21) Appl. No.: 14/133,308

(22) Filed: Dec. 18, 2013

(65) Prior Publication Data

US 2014/0179127 A1   Jun. 26, 2014

(30) Foreign Application Priority Data

Dec. 21, 2012   (FR) ...................................... 12 03566

(51) Int. Cl.
*H01L 23/52* (2006.01)
*H05K 1/02* (2006.01)
*H05K 1/14* (2006.01)
*H01P 5/02* (2006.01)

(52) U.S. Cl.
CPC ............. *H05K 1/0237* (2013.01); *H05K 1/0245* (2013.01); *H05K 1/0253* (2013.01); *H05K 1/148* (2013.01); *H05K 2201/0394* (2013.01); *H05K 2201/09263* (2013.01); *H05K 2201/09727* (2013.01); *H05K 2201/09781* (2013.01); *H01P 5/028* (2013.01)
USPC ........................................... 257/691; 257/664

(58) Field of Classification Search
USPC .................... 257/664, 691, 773, 775
See application file for complete search history.

(56) References Cited

U.S. PATENT DOCUMENTS

| 6,797,891 | B1 * | 9/2004 | Blair et al. ..................... 174/268 |
| 7,838,409 | B2 * | 11/2010 | Zingher et al. ................ 438/599 |
| 2005/0194663 | A1 * | 9/2005 | Ishimura ....................... 257/666 |
| 2005/0224929 | A1 * | 10/2005 | Ikeuchi ......................... 257/666 |
| 2005/0248001 | A1 | 11/2005 | Joodaki | |
| 2009/0151994 | A1 | 6/2009 | Ohsawa et al. | |

FOREIGN PATENT DOCUMENTS

| EP | 1301061 A2 | 4/2003 |
| FR | 2799887 A1 | 4/2001 |

* cited by examiner

*Primary Examiner* — Sheila V. Clark
(74) *Attorney, Agent, or Firm* — Baker & Hostetler LLP (57) ABSTRACT

An interconnection device for elements to be interconnected such as electronic modules or circuits, comprises at least one transmission line coupled to a ground line, the two lines being produced on a face of a dielectric substrate, the interconnection being made substantially at the ends of the transmission line and of the ground line, wherein said interconnection device is flexible over at least a part of its length situated roughly between the elements to be interconnected.

10 Claims, 5 Drawing Sheets

INTERCONNECTION DEVICE FOR ELECTRONIC CIRCUITS, NOTABLY MICROWAVE ELECTRONIC CIRCUITS

CROSS-REFERENCE TO RELATED APPLICATION

This application claims priority to foreign French patent application No. FR 1203566, filed on Dec. 21, 2012, the disclosure of which is incorporated by reference in its entirety.

FIELD OF THE INVENTION

The present invention relates to an interconnection device for electronic circuits, notably microwave electronic circuits. It applies notably to the electronic links between different electronic circuits.

BACKGROUND

The present invention relates to applications for which electrical links are required, between different electronic circuits. After, the concept of electronic circuit should be understood in its widest sense, that is to say that an electronic circuit can take the form of an electronic module, for example a chip, a micro-electro-mechanical system, usually referred to by the acronym "MEMS", a packaged integrated circuit, a module of single or stacked printed circuit boards, a three-dimensional module, etc. These links can electrically interlink physically uniform electronic circuits, for example chips, or even physically dissimilar electronic circuits, when the aim is, for example, to electrically link a chip with an interconnection support with a substrate, a printed circuit board, a package, etc. The signals concerned may be of fast digital or even microwave analogue nature.

More particularly, the present invention relates to applications in which the abovementioned electrical links are intended for the transmission of electrical signals occupying a wide frequency band, and/or which are situated in high frequencies in respect of the dimensions of the links to be produced, and/or which exhibit high power levels. The signals concerned may be of analogue or digital nature. It is, for example, considered that high frequencies in respect to the dimensions of the links to be produced observe the inequality ll>3.10$^9$/1000.f, ll representing the link length in meters, and f representing the frequency of the transmitted signal, in Hertz.

When this inequality is not satisfied, the link produced is all the more difficult to compensate when the characteristic impedance of the interfaces is low, when the required matching level is high, and when the frequency band of interest is wide. Implanting a matching network is not always possible, either because the space available is insufficient, or because the elements to be interconnected are fixed and cannot be modified.

In order to limit the interfering influence of the link elements, produced for example in the form of wires or tapes, the electronic circuits which have to be electrically linked are placed as close as possible to one another. The fastenings of the link elements are, for example, produced by thermocompressed or thermosonic bonding techniques. Consequently, the dimensions and the tolerances which are associated therewith and which are associated with the positioning of the elements, are reduced, to the detriment of the production costs and manufacturing output.

This drawback is all the more critical when the assemblies concerned are complex and long chains of dimensions are involved. For example, in a relatively simple case where chips or power modules are mounted on heat dissipaters, through cavities produced in a substrate, a chain of dimensions can be defined as the sum of the distance from the pad on the substrate relative to the edge of the substrate, of the distance from the edge of the substrate to the edge of the chip or of the module, and of the distance from the edge of the chip or of the module to the land on the chip or the module. A fine tolerance associated with such a chain of dimensions is in practice feasible, but at the price of necessarily costly manufacturing and inspection methods, and at the risk of low output.

Another problem that arises in this context is linked to the fact that it is sometimes necessary to link components in assemblies in which the latter have fixing points situated at different heights. In such cases, not only does the height difference between the components or circuits increase the link length, but also it proves difficult to produce a ground return.

There are solutions known from the prior art, that are implemented to limit the influence of interference phenomena or the mismatching of the connections.

A first known technique consists in using connection leads, which can take various forms. These connection leads can, for example, be through-spikes, lyres, or even flat leads mounted on the surface of printed circuits. One drawback with this technique is that it is not effective for the transmission of high frequency signals, and for the dissipation of high power levels.

A second known technique consists in using micro-wiring comprising a plurality of conductive wires in parallel, usually two wires. Such a technique is, however, often limited by the surface area available from the lands, the surface area of which is limited by the frequency of the signals to be transmitted. It is also limited by the phenomenon of mutual inductance between the conductive wires.

A third known technique consists in using micro-wiring comprising micro-ribbons. This technique, however, also presents the drawback of being limited by the surface area available on the lands, the surface area of which is limited by the frequency of the signals to be transmitted. Another drawback with this technique is that it is significantly more costly to implement industrially, by comparison with the abovementioned second wired technique.

A fourth known technique consists in using conductive microballs, soldered between metallized lands of modules mounted flipped relative to one another. This technique is known by the technical name "flip-chip". For example, an electronic chip or a module equipped with a matrix of conductive balls—often referred to by the acronym BGA, which stands for "Ball Grid Array"—mounted flipped on a substrate. This technique is advantageous for very high frequency links, and/or links with a very wide frequency band. However, this technique is costly to implement industrially, and requires additional steps in the process of manufacturing the devices that implement them. Furthermore, this technique presents the drawback of not being effective in terms of heat dissipation, when it is applied to monolithic electronic circuits, of chip type. It may prove effective when it is applied to modules incorporating a heat dissipater, but in such cases the technique proves overall very costly to implement industrially. This technique also presents the drawback of requiring chips or modules that are designed specifically for this type of assembly. Lastly, it presents a drawback associated with the difficulty, even impossibility, to carry out visual inspections on the links after assembly.

A fifth known technique consists in using micro-lands, assembled directly by soldering or by bonding on electronic circuits mounted flipped relative to one another. This technique is similar to the fourth known technique using microballs, described above. For example, an electronic chip or a module equipped with a matrix of metallized micro-lands—often referred to by the acronym LGA, standing for "Land Grid Array"—mounted flipped on a substrate. This technique also makes it possible to produce very high frequency and/or very wide band links. On the other hand, this technique is not effective for ensuring the matching of the differences in expansion coefficients between the different electronic circuits. In a way similar to the fourth technique described above, this technique presents the drawback of not being effective in terms of heat dissipation, when it is applied to monolithic electronic circuits, of chip type. It may also prove effective when it is applied to modules incorporating a heat dissipater, but at the price of very costly implementation. This technique also presents the drawback of requiring chips or modules that are designed specifically for this type of assembly. It also presents a drawback associated with the difficulty, even impossibility, of carrying out visual inspections of the links after assembly, even when some links are produced with lands which rise up on the sides, for example for modules provided with castellations, according to LGA-specific techniques.

A sixth known technique consists in using micro-bump contacts intended for the production of links by thermocompression or by bonding. This technique makes it possible to produce very high frequency links and/or links with a very wide frequency band. However, this technique does not make it possible to ensure an effective heat dissipation. It also presents a drawback associated with the difficulty, even the impossibility, of carrying out visual inspections on the links after assembly.

A seventh known technique consists of tape-automated bonding, usually referred to by the acronym "TAB". This technique is based on an electronic circuit produced on a thin and flexible substrate, the tracks of which extend beyond and are directly micro-wired to the interconnection bump contacts of the elements to be linked, for example by thermocompression or by collective soldering. This technique allows for a collective link mode, that is to say that all the connection operations for one and the same printed circuit can be carried out simultaneously. The TAB technique makes it possible, for example, to produce links with coplanar transmission lines, of ground/signal/ground type. Such lines present the drawback of being sensitive to dissymetries, of requiring a minimum of six contact points per link, of requiring ground planes of large surface area, as well as great delicacy in the production of the central line, in terms of track width and of separation from the ground lines, in order to obtain typical characteristic impedances of the order of 50Ω.

SUMMARY OF THE INVENTION

One aim of the present invention is to mitigate the drawbacks specific to the abovementioned known devices, by proposing an interconnection device for microwave electronic circuits, that can replace the known interconnection techniques, more often than not wired, or also the coplanar transmission lines of ground/signal/ground type used for the production of links according to techniques of TAB type. An interconnection device according to the invention allows for the transmission of electrical signals occupying a wide frequency band and/or situated in high frequencies with respect to the dimensions to be produced and/or exhibiting high power levels, with a high matching level.

The present invention proposes electrically linking the electronic circuits with an element forming a transmission line of appropriate length and characteristic impedance. This approach is different from the known wired link approaches which are more localized in nature, whereas a transmission line is of distributed nature. This transmission line exhibits a characteristic impedance and in some very favourable cases, a propagation mode, that are very close to those which are exhibited at the interfaces of the electronic circuits to be linked.

The present invention makes it possible to electrically link microwave components by providing a very wide bandwidth and/or an interconnection distance and/or a matching level superior to what can be produced via the techniques known from the prior art. For a given matching level and bandwidth, the maximum distances that can be allowed between elements to be connected with an interconnection device according to one of the embodiments of the present invention are greater than with the solutions known from the prior art. These greater distances make it possible to increase all the dimensions and most of the tolerances on the dimensions associated with the interconnection, such as, for example, the cutting accuracies and distances for the interconnected elements or the machining accuracies and dimensions for the supports.

Because the interconnection device according to the various embodiments of the invention forms a transmission line, the performance levels —for example the insertion and matching losses—of the electrical link depend little on its length, up to the cut-off frequency of the link, which more often than not results from a spurious resonance which also involves elements that are "peripheral" to the interconnection, such as, for example, vias and ground pads at the leads of integrated circuits of "MMIC" (Monolithic Microwave Integrated Circuit) type or of modules. Such is not the case with known links using wires or ribbons.

One advantage of the invention is that it makes it possible to produce electrical links of transmission line type, with dimensions that make it possible to relax the elements of a chain of dimensions, and move the lands further apart.

Another advantage of the invention is that it makes it possible to produce interconnection devices with dimensions that are smaller than links produced with coplanar lines of ground/signal/ground type, that are less complex to assemble, and that have a lower immunity to interference phenomena.

Another advantage of the invention is that the type of electrical link that it proposes better supports high electrical power levels compared to wired links.

Yet another advantage of the invention is that the type of electrical link that it proposes better contains the electromagnetic fields, by comparison with wired links or with ribbon links of comparable size. This makes it possible to minimize the spurious couplings between electronic circuits arranged in proximity to one another.

Yet another advantage of the invention is that it makes it possible to tolerate variations of dimensions associated with the possible temperature variations and with the different expansion coefficients of the materials implemented, that can typically induce relative movements of the order of a micron.

To this end, the subject of the invention is an interconnection device for elements to be interconnected such a electronic modules or circuits, comprising at least one transmission line coupled to a ground line, the two lines being produced on a face of a dielectric substrate, the interconnection being made substantially at the ends of the transmission line and of the ground line, the device being characterized in that it is flexible over at least a part of its length situated roughly between the elements to be interconnected.

In one embodiment of the invention, the device can also comprise at least one metallization surface forming, on the other face of the dielectric substrate at least one coupling element for reinforcing the electrical coupling between the two lines.

In one embodiment of the invention, said part of the length of the interconnection device can be made flexible by at least one narrowing of the width of the transmission and ground lines.

In one embodiment of the invention, said part of the length of the interconnection device can be made flexible by at least one folding of the transmission and ground lines.

In one embodiment of the invention, the folding of the transmission and ground lines can take the form of a zigzag, in the plane containing the transmission and ground lines.

In one embodiment of the invention, the folding of the transmission and ground lines can take the form of a bend, in the plane containing the transmission and ground lines.

In one embodiment of the invention, the folding of the transmission and ground lines can have the form of a bend, on an axis orthogonal to the plane containing the transmission and ground lines.

In one embodiment of the invention, said part of the length of the interconnection device can be made flexible by at least one indent of the dielectric substrate over at least a portion of the length of the interconnection device.

In one embodiment of the invention, said part of the length of the interconnection device can be made flexible by the production of the dielectric substrate in a flexible material, over at least a portion of the length of the interconnection device.

In one embodiment of the invention, the interconnection device can make it possible to produce an interconnection of ground/signal/ground type, the interconnection device comprising a first and a second ground lines and a transmission line, the ground and transmission lines being produced on a face of the dielectric substrate.

In one embodiment of the invention, the dielectric substrate can be defined in such a way that its expansion constant is less than or equal to the expansion constant of the transmission and ground lines.

BRIEF DESCRIPTION OF THE DRAWINGS

Other features and advantages of the invention will become apparent on reading the description, given by way of example, based on the appended drawings which represent.

DETAILED DESCRIPTION

Figure 1A:
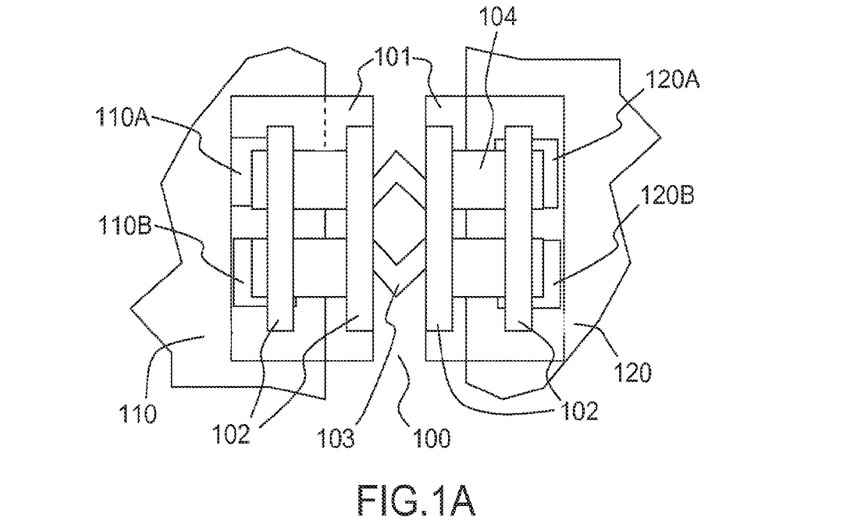
FIGS. 1A, 1B, 1C, respectively a plan, profile and bottom view of an interconnection device according to an exemplary embodiment of the present invention, for the interconnection of two modules elements.
Figure 1B:
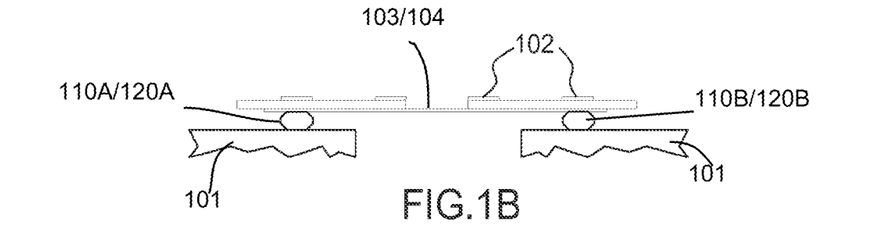
Figure 1C:
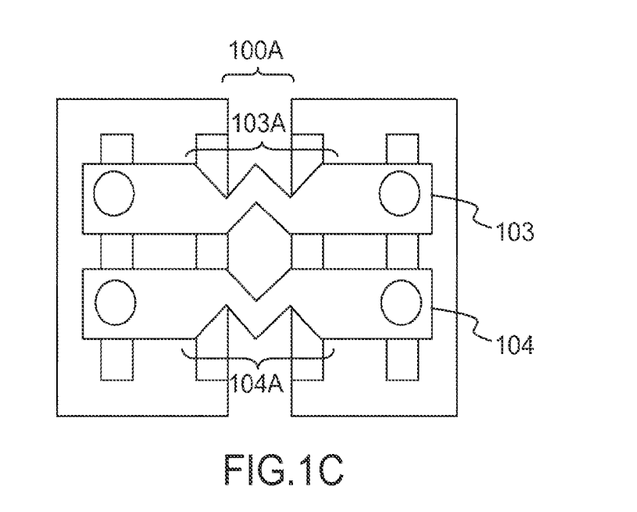

FIGS. 1A, 1B, 1C respectively show a plan, profile and bottom view of an interconnection device according to an exemplary embodiment of the present invention, for interconnecting two modules elements.

Referring to FIG. 1A, an interconnection device 100 comprising a dielectric substrate 101, electrically links a first element 110, for example an electronic module, to a second element 120, for example an electronic module. In the example illustrated by the figure, the first element 110 comprises two connection bump contacts 110A, 110B. For example, the first element 110 may comprise a dielectric substrate in which are produced tracks and components via one or more metallization layers, and on the surface of which are produced metallized surfaces forming the connection bump contacts 110A, 110B. Similarly, the second element 120 may comprise connection bump contacts 120A, 120B.

The interconnection device 100 may comprise, on a bottom face, a conductive transmission line 103, arranged in parallel, and coupled with a ground line 104, the transmission and ground lines 103, 104 being, for example, coplanar. The arrangement of the ground line 104 and of the transmission line 103 illustrated in FIGS. 1A and 1C is a nonlimiting example of the invention, these lines notably being able to be reversed.

The interconnection device 100 advantageously comprises one or a plurality of coupling elements 102 arranged on the top face of the dielectric substrate 101, making it possible to reinforce the coupling between the transmission and ground lines 103, 104. The coupling elements 102 are, for example, arranged on an overall surface roughly corresponding to the surface occupied by the transmission and ground lines 103, 104. The top face of the substrate 101 does not have any ground, or ground plane.

The interconnection between the transmission and ground lines 103, 104 with the elements to be interconnected can be produced substantially at the ends thereof. Referring to FIG. 1B, the ends of the transmission and ground lines 103, 104 can be fixed to the connection bump contacts 110A, 110B and 120A, 120B of the elements 110, 120 to be interconnected, for example by soldering as in the example illustrated by FIG. 1B, by thermocompression, by bonding or else by other known fixing methods. The ends can be directly fixed to the bump contacts, or else link lands or bump contacts can be formed at the end of the transmission and ground lines 103, 104.

The impedance matching can be optimized by an adjustment of the shapes, of the widths of the transmission and ground lines 103, 104, and/or by the separation between the transmission and ground lines 103, 104, and/or by adjusting the number and the shape of the coupling elements 102. The use of a plurality of coupling reinforcements 102 rather than just one notably makes it possible to maximize the passband of the structure. The coupling reinforcements are not grounds or transmission lines. In particular, they are not linked to any potential, ground or otherwise. They are floating from an electrical point of view.

According to a specific feature of the present invention, at least a part 100A of the length of the interconnection device 100 is made flexible, this part being situated roughly between the elements to be interconnected 110, 120. The flexibility of the part 100A can be ensured by a narrowing of the width of the transmission 103 and ground 104 lines and/or by a folding of the transmission 103 and ground 104 lines and/or by a total or partial indent—that is to say an indent of all or part of the thickness—of the dielectric substrate 101 over at least a portion of the length of the interconnection device and/or by the use of a flexible substrate over at least a portion. More particularly, the structure can advantageously be made flexible by a folding of the transmission lines 103 in the same plane as the substrates 101, the bend of the lines being in the same plane as the substrates, that is to say in the plane containing the transmission lines and the ground lines. The impedance variation resulting therefrom is then compensated using coupling reinforcements 102. The bend of the lines 103 can also be produced in an area of ablation of the substrate where it is easier and more effective to implement this bend, the impedance variation being also compensated by the coupling reinforcements 102.

In the nonlimiting example of the present invention illustrated by FIGS. 1A to 1C, the flexibility is conferred by at least one portion 103A of the transmission line 103 and at least one portion 104A of the ground line 104 that are made flexible by virtue of a folding thereof in zigzag form and a narrowing of their respective widths, as well as by an indent of the dielectric substrate 101 over a corresponding portion of the length of the interconnection device 100.

A flexible portion of a length of the order of a micrometer or of a few micrometers can suffice in many typical cases.

The elements to be interconnected 110, 120 can be electronic modules or circuits; the latter term being understood in its widest sense. It is, for example, possible to replace the electronic modules or circuits with electronic chips, three-dimensional modules, components of MEMS type, or micro-opto-electro-mechanical systems, usually referred to by the acronym MOEMS.

Figure 2:
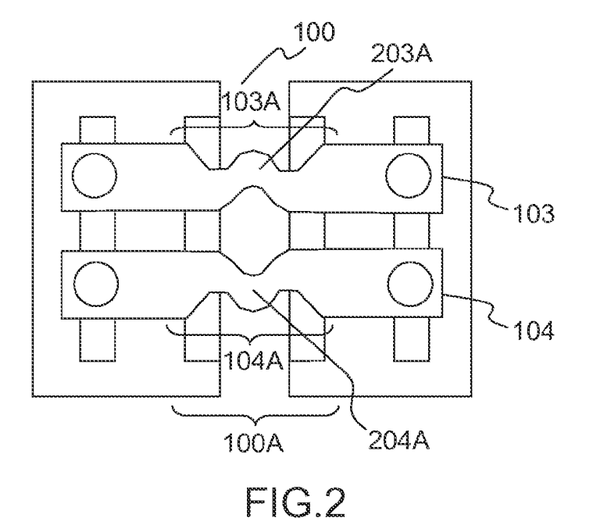
FIG. 2, a bottom view of an interconnection device according to another embodiment of the invention.

FIG. 2 shows a bottom view of an interconnection device according to another embodiment of the invention.

In the nonlimiting example of the present invention illustrated by FIG. 2, the interconnection device 100 can comprise a flexible part 100A formed by a narrowing of the width of the transmission and ground lines 103, 104 over at least a portion 103A, 104A of their respective lengths and/or by a bend 203A, 204A respectively of the transmission and ground lines 103, 104 produced in their respective portion 103A, 104A, the bends 203A, 204A being, in the example of the figure, produced in the main plane containing the transmission and ground lines 103, 104, as well as by an indent of the dielectric substrate 101 over at least a portion and/or by the use of a flexible substrate, like the preceding embodiment described above with reference to FIGS. 1A to 1C.

Figure 3A:
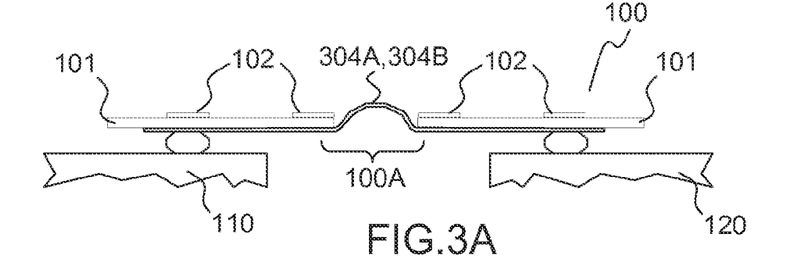
FIGS. 3A and 3B, respectively profile and bottom views of an interconnection device according to another exemplary embodiment of the present invention.
Figure 3B:
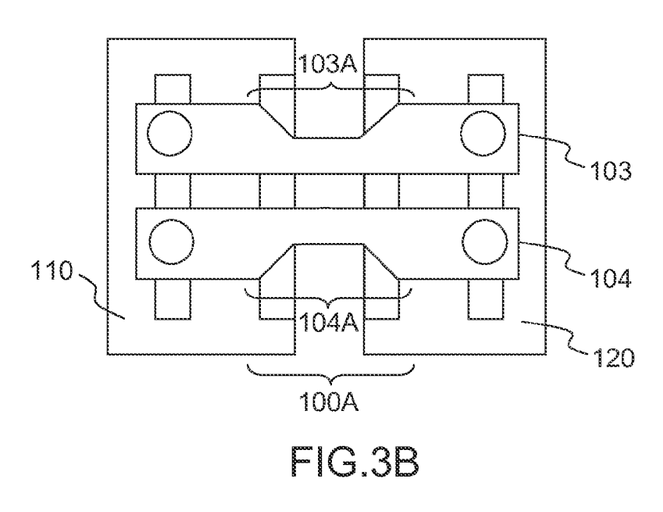

FIGS. 3A and 3B respectively show profile and bottom views of an interconnection device according to another exemplary embodiment of the present invention.

In a manner similar to the exemplary embodiments described above with reference to FIGS. 1A to 1C and 2, an interconnection device 100 for interconnecting two elements to be interconnected 110, 120, can notably comprise a dielectric substrate 101, a transmission line (103), a ground line 104, coupling elements 102. The interconnection device 100 is made flexible over a part of its length 100A, both by an indent of the substrate as in the preceding embodiments, and by a bend 303A, 304A respectively of the transmission and ground lines 103, 104 produced in a respective portion 103A, 104A, the bends 303A, 304A being, in this example, produced on a vertical axis in the figure, orthogonal to the main plane of the interconnection device 100 in which the transmission and ground lines 103, 104 are arranged. In the example illustrated by FIGS. 3A and 3B, and as appears in FIG. 3B, the flexibility of the interconnection device 100 is also ensured by means of a narrowing of the width of the transmission and ground lines 103, 104 in their respective portions 103A, 104A.

Figure 4A:
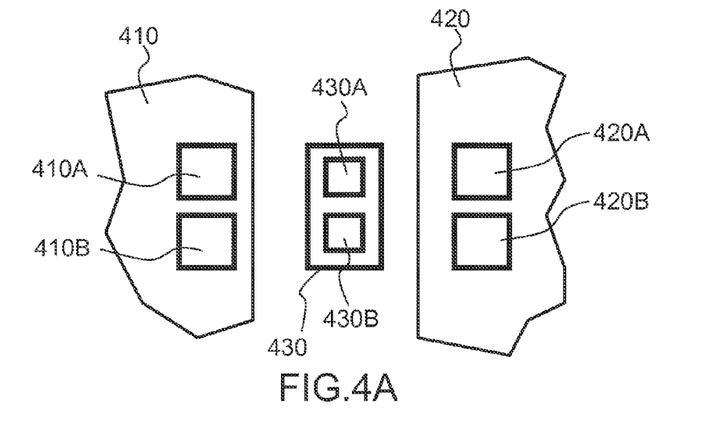
FIGS. 4A, 4B and 4C, respectively a plan view illustrating three elements to be interconnected, the three elements interconnected by means of an interconnection device according to an exemplary embodiment of the invention, and a bottom view of the interconnection device in this example.
Figure 4B:
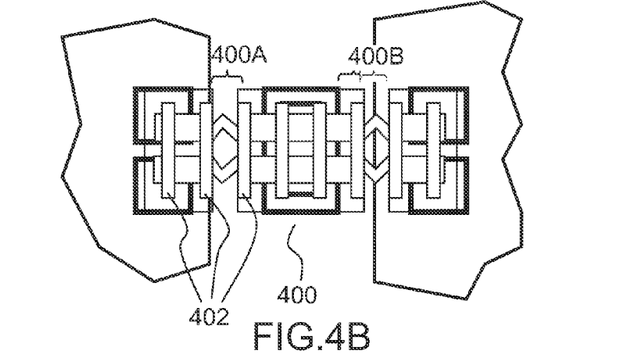
Figure 4C:
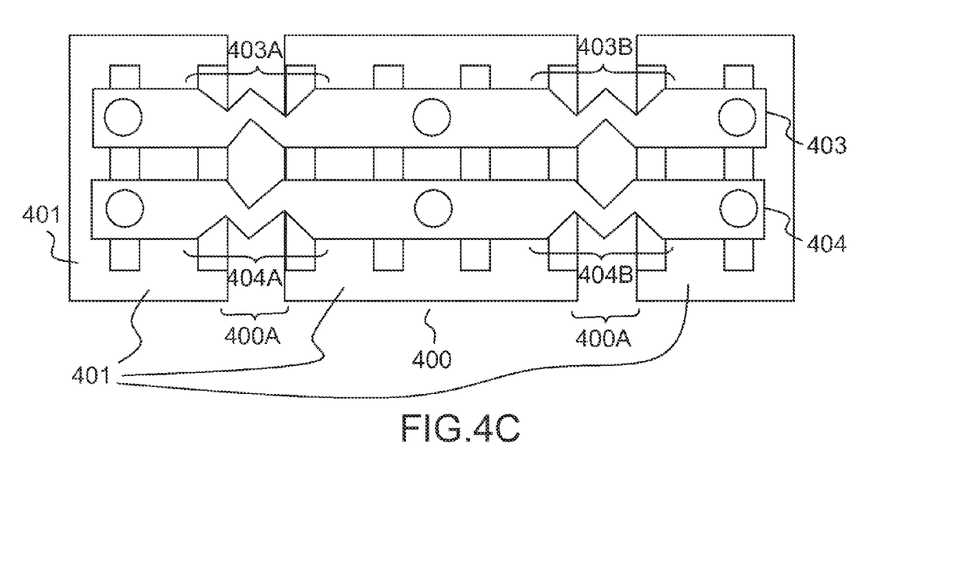

FIGS. 4A to 4C respectively show a plan view illustrating three elements 410, 420, 430 to be interconnected, the three elements interconnected by means of an interconnection device 400 according to an exemplary embodiment of the invention, and a bottom view of the interconnection device in this example.

Like the elements to be interconnected 110, 120 illustrated notably in FIGS. 1A to 1C described previously, the elements 410, 420, 430 to be interconnected can respectively comprise connection bump contacts 410A and 410B, 420A and 420B, and 430A and 430B, as appears notably in FIGS. 4A and 4B, in which, by way of example, the third element to be interconnected 430 is arranged between the first and second elements to be interconnected 410, 420.

A single interconnection device 400 can make it possible to link the three elements to be interconnected 410, 420. The interconnection device 400 thus comprises, in a manner similar to the embodiments described previously, a transmission line 403 and a ground line 404, a dielectric substrate 401, one or a plurality of coupling elements 402, and is made flexible over at least two parts 400A, 400B situated roughly respectively between the first element to be interconnected 410 and the third element to be interconnected 430, and between the third element to be interconnected 430 and the second element to be interconnected 420.

The flexibility is made possible by one or more of the means described previously. In the example illustrated by FIGS. 4A and 4B, the flexibility is permitted both by an indent of the dielectric substrate 401 over two parts of the length of the interconnection device 400, as well as by a folding of the transmission and ground lines 403, 404 in zigzag form in respective portions 403A, 403B and 404A, 404B thereof, and by a narrowing of their respective widths in said respective portions.

Figure 5:
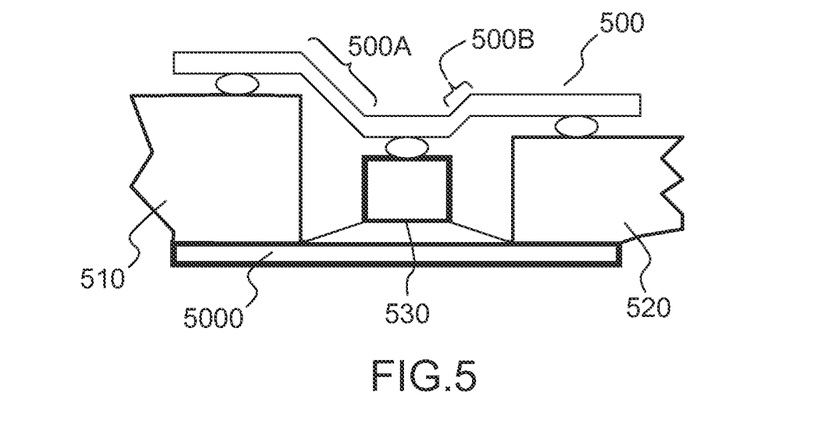
FIG. 5, a profile synoptically illustrating an interconnection device according to another exemplary embodiment of the invention.

FIG. 5 shows a profile view synoptically illustrating an interconnection device according to another exemplary embodiment of the invention.

In the example illustrated by FIG. 5, three elements to be interconnected 510, 520 and 530 can be linked by a single interconnection device 500 in a configuration similar to the embodiment described above with reference to FIGS. 4A to 4C. In this example, the elements to be interconnected 510, 520 and 530 are mounted on one and the same surface 5000 and have different thicknesses, such that their top face, and therefore their link bump contacts which are not represented in the figure, are situated at different heights.

Since the interconnection device 500 is made flexible over at least two parts 500A and 500B situated substantially respectively between the first element 510 and the third element 530 to be interconnected, and between the third element 530 and the second element 520 to be interconnected, the latter can be adapted to the configuration formed by the different elements to be interconnected.

Figure 6A:
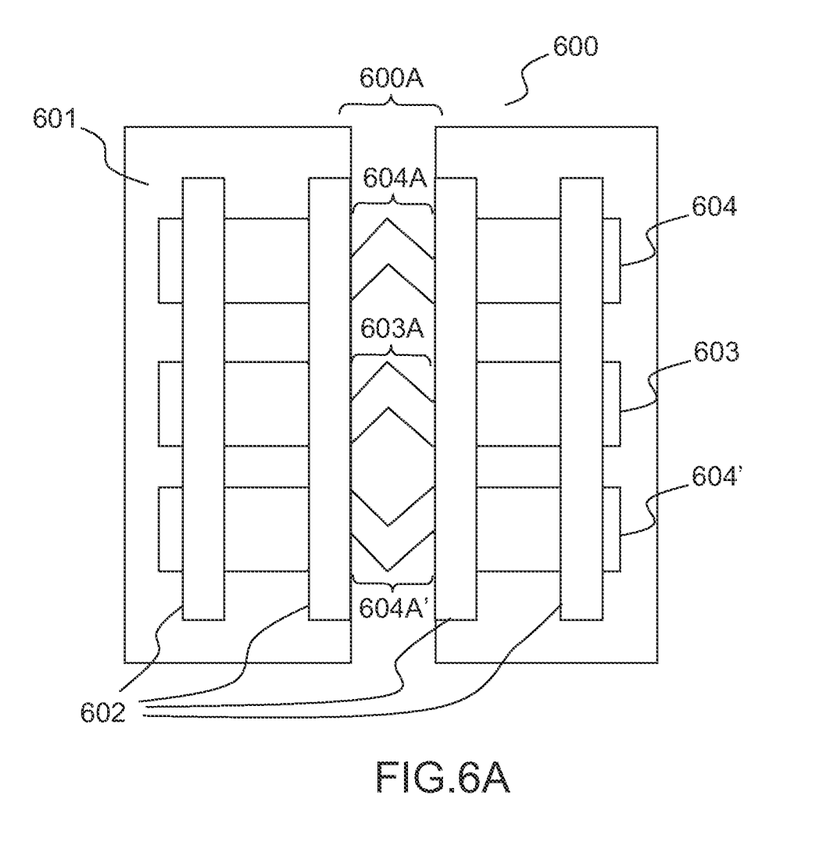
FIGS. 6A and 6B, respectively a plan view and a bottom view of an interconnection device for two elements according to another exemplary embodiment of the invention.
Figure 6B:
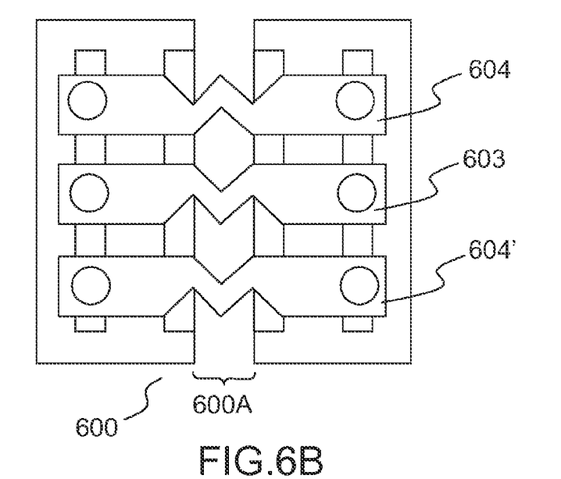

FIGS. 6A and 6B respectively show a plan view and a bottom view of an interconnection device 600 for two elements according to another exemplary embodiment of the invention. An interconnection device according to the present invention can also be extended to interconnections of ground/signal/ground type.

The configuration of the interconnection device 600 is similar to the configuration shown in the embodiment described previously with reference to FIGS. 1A to 1C, except that an interconnection of ground/signal/ground type is produced from two ground lines 604, 604' and a transmission line 603, the transmission line being arranged between the two ground lines 604, 604', substantially parallel therewith. In a manner also similar to the embodiment described previously with reference to FIGS. 1A to 1C, a part 600A of the length of the interconnection device 600 is made flexible, this part being situated substantially between the elements to be interconnected 610, 620. In the nonlimiting example of the present invention illustrated by FIGS. 6A and 6B, the flexibility is conferred by at least one portion 603A of the transmission line 603 and at least one portion 604A and one portion 604A' respectively of the two ground lines 604, 604' made flexible by virtue of a folding thereof in zigzag form and of a narrowing of their respective widths, as well as by an indent of the dielectric substrate 601 over a corresponding portion of the length of the interconnection device 600.

Figure 7A:
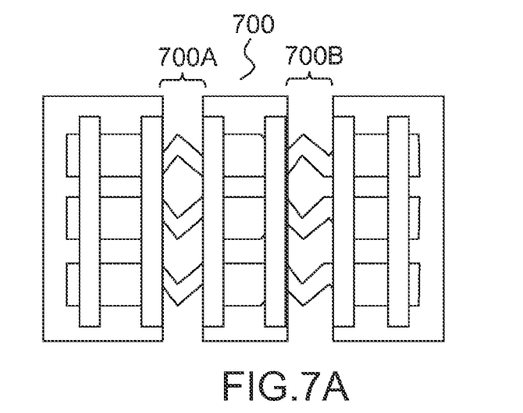
FIGS. 7A and 7B, respectively a plan view and a bottom view of an interconnection device for three elements according to another exemplary embodiment of the invention.
Figure 7B:
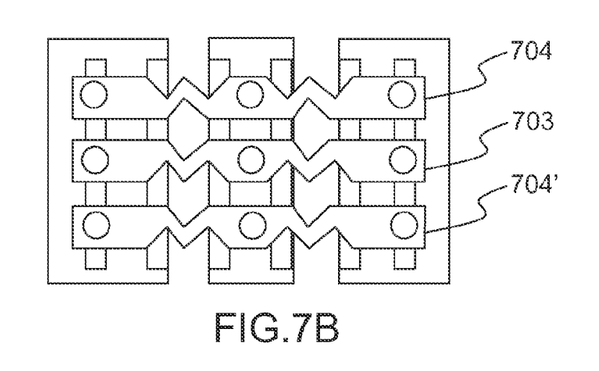

FIGS. 7A and 7B respectively show a plan view and a bottom view of an interconnection device 700 for three elements according to another exemplary embodiment of the invention.

The configuration illustrated by FIGS. 7A and 7B makes it possible to link, by the interconnection device 700, three elements to be interconnected, like the embodiment described previously with reference to FIG. 4C, except that the interconnection device comprises two ground lines 704, 704' and a transmission line 703, like the interconnection device 600 described above with reference to FIGS. 6A and 6B, the interconnection device 700 being made flexible over two parts 700A, 700B.

It may be advantageous for the assembly of the elements to be interconnected and of an interconnection device according to one of the embodiments of the invention to be done at a temperature greater than or equal to the maximum operating temperature of the device, and for the materials chosen for all the elements to be determined such that the interconnection between them is by compression at a lower temperature. For example, it may be advantageous to choose a substrate with a thermal expansion constant, also referred to as a thermal expansion coefficient, that is substantially lower than a thermal expansion constant of the system in which it is inserted. The thermal expansion constant of the substrate may also be chosen to be equal to or slightly lower than the thermal expansion constant of the transmission and ground lines, because a bimetallic strip effect upward more often than not preferable, notably if a ground plane or an obstacle below is situated in proximity.

The present invention also offers the advantage of allowing for a better impedance control and a lesser dispersion of performance levels. It is also well suited to high power or strong current signals.

The invention claim is:

1. An interconnection device for elements to be interconnected including electronic modules or circuits, the interconnection device comprising: at least one transmission line coupled to a ground line, the at least one transmission line and the ground line being produced on a bottom face of a dielectric substrate and interconnected substantially at respective ends of the at least one transmission line and of the ground line, said interconnection device being flexible over at least a part of its length situated between the elements to be interconnected, said interconnection device comprising, on a top face of the dielectric substrate at least one coupling element for reinforcing the electrical coupling between the at least one transmission line and the ground line, said coupling element being electrically floating.

2. The interconnection device according to claim 1, wherein said part of the length of the interconnection device is made flexible by at least one narrowing of a width of the at least one transmission and ground lines.

3. The interconnection device according to claim 1, wherein said part of the length of the interconnection device is made flexible by at least one folding of the at least one transmission and ground lines.

4. The interconnection device according to claim 3, wherein the at least one folding of the at least one transmission and ground lines is shaped as a zigzag in a plane containing the at least one transmission and ground lines.

5. The interconnection device according to claim 3, wherein the at least one folding of the at least one transmission and ground lines is shaped as a bend in a plane containing the at least one transmission and ground lines.

6. The interconnection device according to claim 3, wherein the at least one folding of the transmission and ground lines is shaped as a bend on an axis orthogonal to a plane containing the at least one transmission and ground lines.

7. The interconnection device according to claim 1, wherein said part of the length of the interconnection device is made flexible by at least one indent of the dielectric substrate over at least a portion of the length of the interconnection device.

8. The interconnection device according to claim 1, wherein said part of the length of the interconnection device is made flexible by a production of the dielectric substrate in a flexible material, over at least a portion of the length of the interconnection device.

9. The interconnection device according to claim 1, wherein the interconnection is of a ground/signal/ground type, the interconnection device further comprising a first ground line and a second ground line and one transmission line, the first ground line, the second ground line, and the one transmission line being produced on the top face or the bottom face of the dielectric substrate.

10. The interconnection device according to claim 1, wherein thermal expansion constant of the dielectric substrate is less than or equal to a thermal expansion constant of the at least one transmission and ground lines.

* * * * *